United States Patent
Lee et al.

(10) Patent No.: US 7,393,767 B2
(45) Date of Patent: Jul. 1, 2008

(54) METHOD FOR IMPLANTING A CELL CHANNEL ION OF SEMICONDUCTOR DEVICE

(75) Inventors: Won Chang Lee, Seoul (KR); Woo Kyung Sun, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 267 days.

(21) Appl. No.: 11/004,835

(22) Filed: Dec. 7, 2004

(65) Prior Publication Data

US 2006/0046404 A1    Mar. 2, 2006

(30) Foreign Application Priority Data

Sep. 2, 2004    (KR) ............. 10-2004-0070016

(51) Int. Cl.
*H01L 21/425* (2006.01)
(52) U.S. Cl. .............. 438/527; 257/E21.618; 438/289; 438/291; 438/514
(58) Field of Classification Search ........... 438/551, 438/514, 289, 291, 527; 257/E21.618
See application file for complete search history.

(56) References Cited

U.S. PATENT DOCUMENTS

| | | | | |
|---|---|---|---|---|
| 5,079,603 A | * | 1/1992 | Komori et al. | 257/316 |
| 5,149,664 A | * | 9/1992 | Shin et al. | 438/277 |
| 5,422,297 A | * | 6/1995 | Yamauchi | 438/289 |
| 5,514,889 A | * | 5/1996 | Cho et al. | 257/316 |
| 5,672,521 A | * | 9/1997 | Barsan et al. | 438/276 |
| 5,939,743 A | * | 8/1999 | Ema | 257/296 |
| 6,008,093 A | * | 12/1999 | Aoki et al. | 438/276 |
| 6,303,474 B1 | * | 10/2001 | Steffen | 438/514 |
| 6,337,250 B2 | * | 1/2002 | Furuhata | 438/301 |
| 6,362,049 B1 | * | 3/2002 | Cagnina et al. | 438/258 |
| 6,570,233 B2 | * | 5/2003 | Matsumura | 257/385 |
| 6,597,038 B1 | * | 7/2003 | Hashimoto | 257/344 |
| 6,617,632 B2 | * | 9/2003 | Taniguchi et al. | 257/296 |
| 6,933,557 B2 | * | 8/2005 | Lojek | 257/315 |
| 7,008,848 B2 | * | 3/2006 | Lee et al. | 438/276 |
| 2001/0032983 A1 | * | 10/2001 | Miyagawa et al. | 257/79 |
| 2004/0097018 A1 | * | 5/2004 | Lee et al. | 438/128 |
| 2005/0213391 A1 | * | 9/2005 | Lojek | 365/185.29 |

FOREIGN PATENT DOCUMENTS

| | | | |
|---|---|---|---|
| JP | 2006073981 A | * | 3/2006 |
| KR | 100167271 B1 | | 9/1998 |
| KR | 1020040000772 A | | 1/2004 |
| KR | 1020040008725 A | | 1/2004 |
| KR | 1020040008725 A | | 1/2004 |

\* cited by examiner

*Primary Examiner*—Fernando L. Toledo
*Assistant Examiner*—Jarrett J Stark
(74) *Attorney, Agent, or Firm*—Townsend and Townsend and Crew LLP

(57) ABSTRACT

A method for implanting a cell channel ion of semiconductor device is disclosed. In accordance with the method, the bit line contact region and the edge portion of the channel region adjacent to the bit line contact region in the cell region are subjected to a selective cell channel implant process two times using a ion implant mask and rest of the cell region is subjected to cell channel implant process only once so that a impurity concentration of the storage node contact region is maintained at a lower level for minimal leakage current in the storage node contact region.

8 Claims, 4 Drawing Sheets

METHOD FOR IMPLANTING A CELL CHANNEL ION OF SEMICONDUCTOR DEVICE

BACKGROUND OF THE INVENTION

1. Field of the Invention

The present invention generally relates to a method for implanting a cell channel ion of semiconductor device, and more specifically, to a method for implanting a cell channel ion of semiconductor device wherein a bit line contact region and an edge portion of a channel region adjacent to the bit line contact region in a cell region are subjected to cell channel implant process two times and rest of the cell region is subjected to cell channel implant process only once so that the leakage current in the storage node contact region is reduced and the refresh characteristic of the device is improved.

2. Description of the Prior Art

As an integration of a semiconductor device progresses, increasing the integration density of semiconductor device has become a very important factor. However, improving the characteristics of each device has become an equally important factor. In particular, the refresh characteristic of a device has a large effect over the operation of the device. In order to improve the refresh characteristic of the device, a method for optimizing channel ion implant or source/drain junction ion implant has been proposed. However, the method has its limit in improving refresh characteristic of the device. Therefore, a method for reducing a leakage current in a storage node contact region is needed to overcome the limit.

SUMMARY OF THE INVENTION

It is an object of the present invention to provide a method for implanting a cell channel ion of semiconductor device wherein a bit line contact region and an edge portion of a channel region adjacent to the bit line contact region in a cell region are subjected to cell channel implant process two times and rest of the cell region is subjected to cell channel implant process only once so that a impurity concentration of the bit line contact region and the edge portion of a channel region is higher that the other areas of the cell region.

In order to achieve the above object of the present invention, there is provided a method for implanting a cell channel ion of semiconductor device having a semiconductor substrate including a cell region, the method comprising the step of performing a cell channel ion implant process wherein the cell channel ion is implanted two times in a first portion of the cell region and the cell channel ion is implanted once in a second portion of the cell region so that an impurity concentration of the first region is higher than that of the second region, wherein the first portion of the cell region is inclusive of a bit line contact region and an edge portion of a channel region adjacent to the bit line contact region, and the second portion of the cell region is inclusive of a remaining portion of the cell region and exclusive of the first portion of the cell region.

In accordance with one aspect of the present invention, the cell channel ion implant process comprises: performing a first cell channel implant process to implant an impurity into a surface of the semiconductor substrate in the first portion and the second portion of the cell region; forming a photoresist film pattern exposing the first portion of the cell region; performing a second cell channel implant process to implant an impurity into the first portion of the cell region using the photoresist film pattern as an ion implant mask; and removing the photoresist film pattern.

In accordance with another aspect of the present invention, the cell channel ion implant process comprises: forming a photoresist film pattern exposing the first portion of the cell region; performing a first cell channel implant process to implant an impurity into the first portion of the cell region using the photoresist film pattern as an ion implant mask; removing the photoresist film pattern; and performing a second cell channel implant process to implant an impurity into a surface of the semiconductor substrate in the first portion and the second portion of the cell region.

DETAILED DESCRIPTION OF THE PREFERRED EMBODIMENTS

The present invention will be explained in detail referring to the accompanying drawings.

Figure 1A:
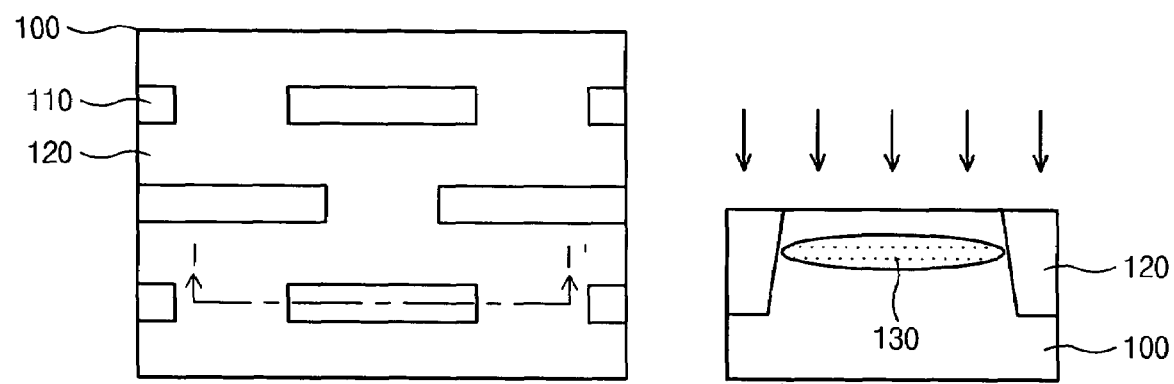
FIGS. 1a through 1c are plane and cross-sectional views illustrating a method for implanting a cell channel ion of semiconductor device in accordance with the present invention.
Figure 1B:
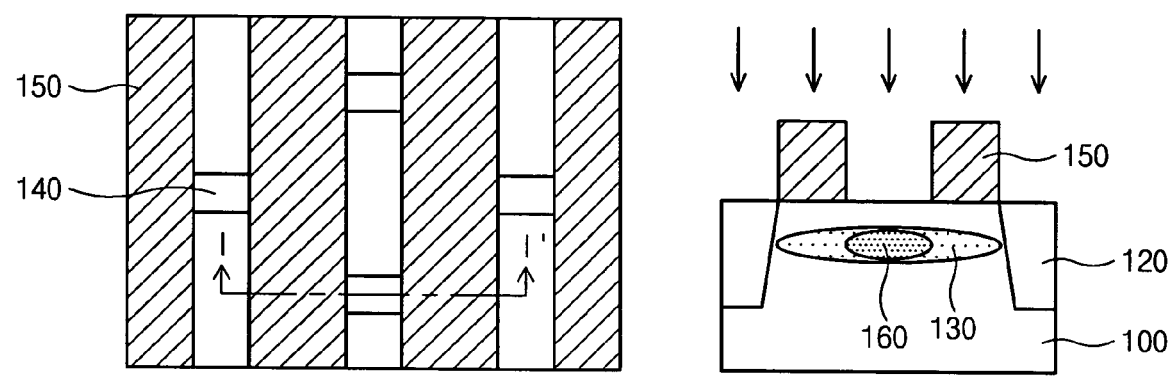
Figure 1C:
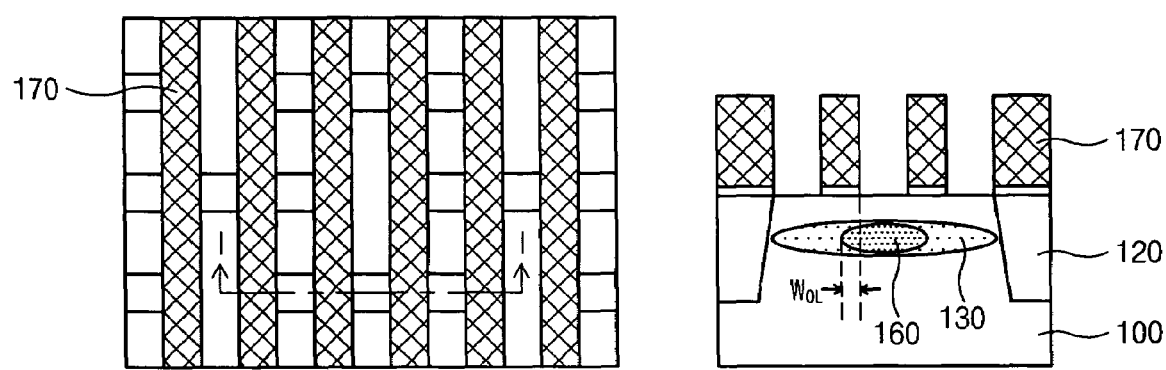

FIGS. 1a through 1c are plane and cross-sectional views illustrating a method for implanting a cell channel ion of semiconductor device in accordance with the present invention, wherein the cross-sectional views in the right are cross sections taken along the line I-I' of the plane views in the right.

Referring to FIG. 1a, a device isolation film 120 defining an active region 110 is formed in a cell region of a semiconductor substrate 100 via a conventional device isolation process. The cell region comprises a first portion and a second portion. The first portion of the cell region includes a bit line contact region and an edge portion of a channel region adjacent to the bit line contact region, and the second portion of the cell region includes the remaining portion of the cell region excluding the first portion of the cell region.

Thereafter, a first cell channel implant process is performed to implant an impurity into the entire surface of the semiconductor substrate 100 including the first portion and the second portion of the cell region, thereby forming an impurity implant region 130.

Referring to FIG. 1b, a photoresist film pattern 150 exposing the bit line contact region and the edge portion of the channel region adjacent to the bit line contact region, i.e. the first portion of the cell region, is formed on the semiconductor substrate 100. The photoresist film pattern 150 may be a line pattern as shown in FIG. 1b. Preferably, the width of the edge portion of the channel region exposed by the photoresist film pattern 150 is smaller than that of a word line (not shown). That is, the width of the region (denoted as $W_{OL}$ in FIG. 1c) where an impurity implant region 160 formed by a second cell channel implant process (denoted by arrows in FIG. 1b) and the word line overlap is smaller than that of the word line.

Thereafter, the semiconductor substrate 100 is subjected to a second cell channel implant process to implant an impurity into the first portion of the cell region using the photoresist film pattern 150 as an ion implant mask, thereby forming an impurity implant region 160. Preferably, a dose of the second cell channel implant process is 0.1 to 10 times of that of the first cell channel implant process. The impurity used in the first cell channel implant process may be the same as or different from that of the second cell channel implant process.

The impurity is implanted two times in the bit line contact region and the edge portion of the channel region adjacent to the bit line contact region, i.e. the first portion of the cell region by the first and the second cell channel implant processes while The impurity is implanted only once in the remaining portion of the cell region, i.e. the first portion of the cell region by the first cell channel implant processes so that a impurity concentration of the first portion of the cell region is higher that the other areas of the cell region.

Referring to FIG. 1c, the photoresist film pattern 150 is removed and a word line 170 and a source/drain region (not shown) are then formed.

As one embodiment of the present invention, the order of the first and the second cell channel implant processes may be interchanged. That is, a photoresist film pattern exposing the bit line contact region and the edge portion of the channel region adjacent to the bit line contact region is formed on the semiconductor substrate prior to a first cell channel implant process and then removed to perform a second cell channel implant process without any ion implant masks so that an impurity is implanted on the entire surface of the semiconductor substrate. In accordance with the embodiment, it is preferable that a dose of the first cell channel implant process is 0.1 to 10 times of that of the second cell channel implant process.

Figure 2:
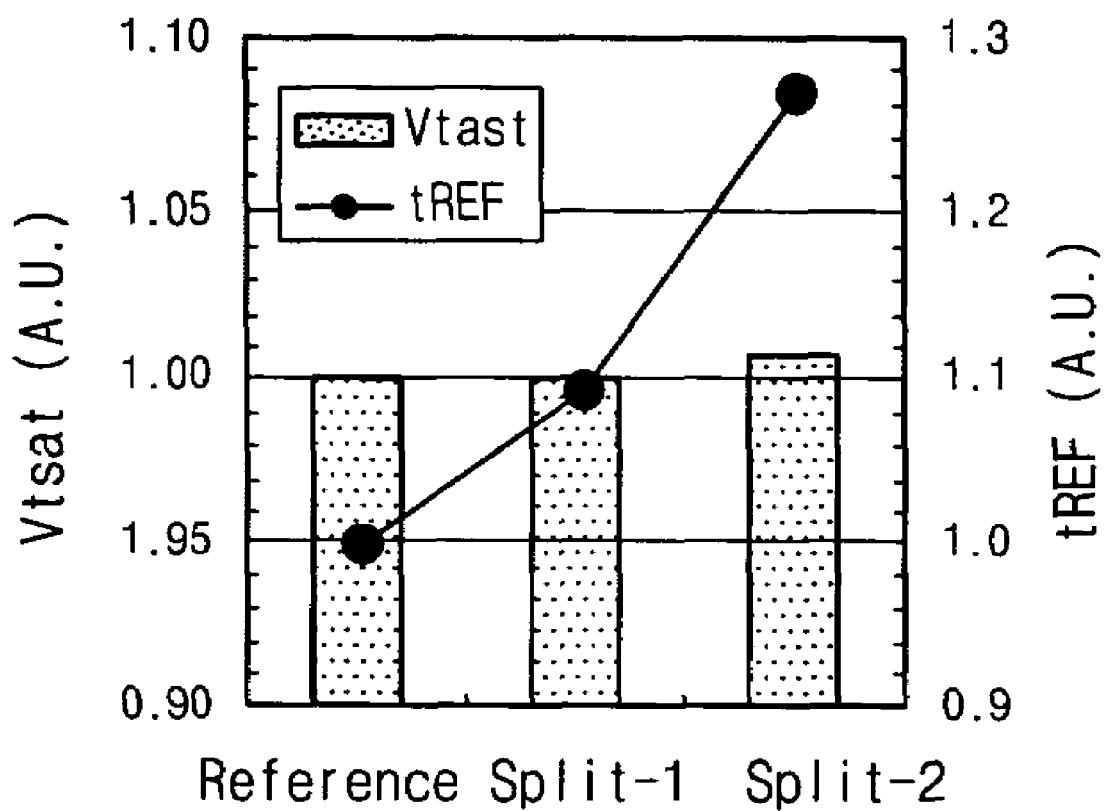
FIG. 2 is a graph illustrating a threshold voltage and a pause refresh time of a semiconductor device manufactured in accordance with the method of the present invention.

FIG. 2 is a graph illustrating a threshold voltage and a pause refresh time of a semiconductor device manufactured in accordance with the method of the present invention.

Referring to FIG. 2, split-1 and split-2 denote threshold voltage and refresh time obtained by varying the doses of the first and the second cell channel implant processes, respectively. As shown in FIG. 2, the semiconductor device manufactured in accordance with the method of the present invention has the same threshold voltage while its refresh time is 10 to 27% improved.

As described above, in accordance with the present invention, the bit line contact region and the edge portion of the channel region adjacent to the bit line contact region in the cell region are subjected to a selective cell channel implant process two times using a ion implant mask and rest of the cell region is subjected to cell channel implant process only once so that a impurity concentration of the storage node contact region is maintained at a lower level, thereby reducing the leakage current and improving the refresh characteristic of the device.

What is claimed is:

1. A method for implanting a cell channel ion of semiconductor device having a semiconductor substrate including a cell region, the method comprising performing first and second cell channel ion implant processes before the formation of a word line, wherein the first cell channel ion implant process is performed in a first portion and a second portion of the cell region and the second cell channel ion implant process is further performed in the first portion of the cell region so that an impurity concentration of the first portion is higher than that of the second portion, wherein the first portion of the cell region comprises a bit line contact region and an edge portion of a channel region adjacent to the bit line contact region, and the second portion of the cell region comprises a remaining portion of the cell region other than the first portion of the cell region.

2. The method according to claim 1, wherein the cell channel ion implant process comprises:

performing a first cell channel implant process to implant an impurity into a surface of the semiconductor substrate in the first portion and the second portion of the cell region;

forming a photoresist film pattern exposing the first portion of the cell region;

performing a second cell channel implant process to implant an impurity into the first portion of the cell region using the photoresist pattern as an ion implant mask; and removing the photoresist film pattern.

3. The method according to claim 1, wherein the cell channel ion implant process comprises:

forming a photoresist film pattern exposing the first portion of the cell region;

performing a first cell channel implant process to implant an impurity into the first portion of the cell region using the photoresist film pattern as an ion implant mask;

removing the photoresist film pattern; and performing a second cell channel implant process to implant an impurity into a surface of the semiconductor substrate in the first portion and the second portion of the cell region.

4. The method according to claim 2, wherein the photoresist film pattern includes a line pattern.

5. The method according to claim 2, wherein a dose of the second cell channel implant process is 0.1 to 10 times of that of the first cell channel implant process.

6. The method according to claim 3, wherein a dose of the first cell channel implant process is 0.1 to 10 times of that of the second cell channel implant process.

7. The method according to claim 2, wherein the impurity of the first cell channel implant process is the same as or different from that of the second cell channel implant process.

8. The method according to claim 3, wherein the impurity of the first cell channel implant process is the same as or different from that of the second cell channel implant process.

* * * * *